(12) United States Patent
Nishiyama et al.

(10) Patent No.: US 7,374,474 B2
(45) Date of Patent: May 20, 2008

(54) POLISHING PAD FOR CMP, METHOD FOR POLISHING SUBSTRATE USING IT AND METHOD FOR PRODUCING POLISHING PAD FOR CMP

(75) Inventors: Masaya Nishiyama, Hitachi (JP); Masanobu Habiro, Hitachi (JP); Yasuhito Iwatsuki, Tokyo (JP); Hirokazu Hiraoka, Tokyo (JP)

(73) Assignee: Hitachi Chemical Co., Ltd., Tokyo (JP)

( * ) Notice: Subject to any disclaimer, the term of this patent is extended or adjusted under 35 U.S.C. 154(b) by 0 days.

(21) Appl. No.: 10/491,165

(22) PCT Filed: Oct. 8, 2002

(86) PCT No.: PCT/JP02/10437

§ 371 (c)(1),
(2), (4) Date: Mar. 30, 2004

(87) PCT Pub. No.: WO03/032379

PCT Pub. Date: Apr. 17, 2003

(65) Prior Publication Data

US 2004/0224623 A1 Nov. 11, 2004

(30) Foreign Application Priority Data

Oct. 9, 2001 (JP) ............................. 2001-311410
Jan. 29, 2002 (JP) ............................. 2002-020236

(51) Int. Cl.
*B24B 1/00* (2006.01)

(52) U.S. Cl. ........................................ 451/41; 451/532

(58) Field of Classification Search ................ 451/921, 451/532, 527; 428/91, 297.4; 51/298
See application file for complete search history.

(56) References Cited

U.S. PATENT DOCUMENTS 4,021,209 A * 5/1977 Binkley ....................... 51/298
5,567,503 A * 10/1996 Sexton et al. ................ 428/143
5,944,589 A 8/1999 Nakajima (Continued)

FOREIGN PATENT DOCUMENTS

EP 1118432 7/2001

(Continued)

OTHER PUBLICATIONS

Notification of Transmittal of Copies of Translation of the International Preliminary Examination Report for International Application No. PCT JP/2002/010437 dated May 27, 2004.

(Continued)

*Primary Examiner*—Jacob K. Ackun, Jr.
(74) *Attorney, Agent, or Firm*—Westerman, Hattori, Daniels & Adrian, LLP.

(57) ABSTRACT

In CMP technology for planarizing an interlayer insulation film, a BPSG film, an insulation film for shallow trench isolation, or the like, in the production process of a semiconductor element, irregularities of a matter being polished, e.g. a silicon oxide film, are planarized efficiently at a high speed while suppressing the occurrence of polishing flaws on the substrate by employing a polishing pad having organic fibers exposed on the surface thereof abutting against the matter being polished.

15 Claims, 1 Drawing Sheet

U.S. PATENT DOCUMENTS

| | | |
|---|---|---|
| 6,254,988 B1 * | 7/2001 | Zhu et al. .................... 428/373 |
| 6,533,645 B2 * | 3/2003 | Tolles .......................... 451/41 |
| 6,566,286 B1 * | 5/2003 | Sakaguchi et al. .......... 442/281 |
| 6,793,561 B2 * | 9/2004 | Bachand et al. .............. 451/56 |
| 2002/0058426 A1 * | 5/2002 | Mandigo et al. ............ 438/792 |

FOREIGN PATENT DOCUMENTS

| | | |
|---|---|---|
| JP | 10-255864 | 8/1998 |
| JP | 11-151660 | 6/1999 |
| JP | 2002-166352 | 6/2002 |

OTHER PUBLICATIONS

Office Action dated Mar. 12, 2007 issued in corresponding Japan Application No. 2001-311409.

* cited by examiner

Fig. 1

POLISHING PAD FOR CMP, METHOD FOR POLISHING SUBSTRATE USING IT AND METHOD FOR PRODUCING POLISHING PAD FOR CMP

TECHNICAL FIELD

The present invention relates to a polishing pad for CMP, which is usable in the chemical mechanical polishing (CMP) method employed in the production technology of semiconductor elements and in the polishing method employed in thee production technology of hard discs. The present invention further relates to a method for polishing a substrate by using the polishing pad and to a method for producing a polishing pad.

BACKGROUND ART

In the present ultra large scale integrated circuits, packaging density is increasing, and a variety of fine processing techniques are being studied and developed. Design rule has already been of the order of sub-half-micron. One of the techniques developed to meet the requirement for such a strict miniaturization is the CMP (chemical mechanical polishing) technique. In the production process of semiconductor devices, this technique can completely planarize a layer to be exposed to light, thereby lightening the burden of exposure techniques and stabilizing the yield. This, therefore, is a technique essential for planarizing an interlayer insulation film or a BPSG film, shallow trench isolation, etc.

According to the conventional polishing method employed in the production process of semiconductor devices to planarize an inorganic insulation film, such as a silicon oxide insulation film formed by plasma-CVD (Chemical Vapor Deposition), low-pressure-CVD, etc., a substrate on which a film to be polished is formed is pressed against a polishing pad, and the substrate or the polishing pad is moved while feeding an abrasive between the film to be polished and the polishing pad.

A polishing pad made of polyurethane foam has commonly been used in the above-described method, which however is insufficient in the speed of polishing the inorganic insulation film, and involves the great problem that polishing flaws occur during polishing on the surface of the oxide film due to polishing particles. In the case of a pad made of a foamed or non-foamed resin, decreasing the hardness of the pad surface reduces the polishing flaws effectively, but materials of low hardness do not suit to planarize irregularities efficiently in the production of semiconductor devices. To solve the problem, pad materials compromising the reduction of polishing flaws and the improvement of flatness are used, but are not enough to solve the problem of polishing flaws.

DISCLOSURE OF INVENTION

The present invention provides a polishing pad and a method of polishing a substrate whereby in the CMP technology employed in the production of semiconductor elements for planarizing an interlayer insulation film, a BPSG film, an insulation film for shallow trench isolation, etc., irregularities on a matter to be polished, such as a silicon oxide film, are planarized efficiently at a high speed while suppressing the occurrence of polishing flaws on the substrate. The present invention further provides a method of producing the polishing pad.

The present invention has been made on basis of the finding that in the CMP technology for planarizing a interlayer insulation film, a BPSG film or an insulation film for shallow trench isolation, a silicon oxide film is polished at a high speed while suppressing the occurrence of polishing flaws by using a polishing pad for CMP having a very thin fiber layer on the surface of an elastic body.

Accordingly, the present invention relates to a polishing pad for polishing a substrate or a thin film formed on a substrate, which polishing pad contains organic fibers exposed on a surface of the polishing pad.

The present invention further relates to a polishing pad having a multilayer structure, comprising the above-described polishing pad and a layer, which are laminated together and have different elastic moduli.

The present invention further relates to a polishing pad material that may be suitably used for the production of the polishing pad. The polishing pad material has a plate-like shape, comprises fibers and a resin fixing the fibers to form the plate-like shape, and has at least one surface layer which is substantially non-porous and comprises organic fibers and the resin fixing the organic fibers.

The present invention also relates to an advantageous method of producing the above-described polishing pad.

Accordingly, the present invention relates to a method of producing a polishing pad by using a polishing pad material of a plate-like shape, which comprises fibers and a resin fixing the fibers to form the plate-like shape and has at least one surface layer being substantially non-porous and comprising organic fibers and the resin fixing the organic fibers. According to this method, the surface of the surface layer of the polishing pad material is mechanically polished, so that the surface layer has a surface on which the organic fibers are exposed (first production method).

The present invention further relates to a method of producing a polishing pad, comprising layering a resin-impregnated sheet-form fiber base material and a resin-unimpregnated sheet-form fiber base material so that a resin-unimpregnated sheet-form fiber base material comprising organic fibers is located on at least one surface, and unifying them by thermocompression molding to form a polishing pad having at least one surface on which the organic fibers are exposed (second production method).

The present invention further relates to a method of producing a polishing pad, comprising layering a resin-impregnated sheet-form fiber base material and a resin-unimpregnated sheet-form fiber base material so that a resin-unimpregnated sheet-form fiber base material comprising organic fibers is located on at least one surface, unifying them by thermocompression molding to form a polishing pad material having no surface on which the organic fibers are exposed, and allowing the organic fibers to be exposed by mechanically polishing the surface of the polishing pad material on which the resin-unimpregnated sheet-form fiber material is located (third production method).

The present invention further relates to a method of polishing a substrate, comprising pressing the substrate against the surface of the polishing pad of this invention on which the organic fibers are exposed, and relatively sliding the substrate and the polishing pad while an abrasive is being fed between the substrate and the polishing pad.

Polishing a semiconductor substrate by using the polishing pad of the present invention having a surface on which an exposed fiber layer of organic fibers is formed enables planarization at a high speed and reduction of polishing flaws. The reason is presumed as follows. The reason for the high polishing speed may be that polishing particles are efficiently held between and on the surfaces of the exposed fibers and contact the surface being polished with increased frequency. The reason for the reduction of the occurrence of flaws on the matter being polished may be as follows. Among foreign matters and polishing particles, huge ones have possibly caused the occurrence of flaws, but when they are sandwiched between the surface of a matter being polished and the exposed organic fiber layer, they dig themselves into the bundle of fibers and escape from high-pressure contact with the matter being polished.

Being molded with a resin-unimpregnated sheet-form fiber base material comprising organic fibers, the polishing pad produced by the second production contains in its surface part some resin oozing out from the lower layers on molding, but the resin content in the surface part is so small as to provide a good layer of exposed organic fibers on the surface. The resin oozing out in the surface part fixes the basal parts of the organic fibers securely and keeps the layer of exposed organic fibers for a long term.

EXPLANATION OF SYMBOLS

1: elastic body layer
2: exposed fibrous layer

BEST MODE FOR CARRYING OUT THE INVENTION

Herein, the state where organic fibers are exposed on a surface of a polishing pad means that organic fibers are protruding from and exposed on at least one surface of an underlying layer, such as an elastic body.

Figure 1:
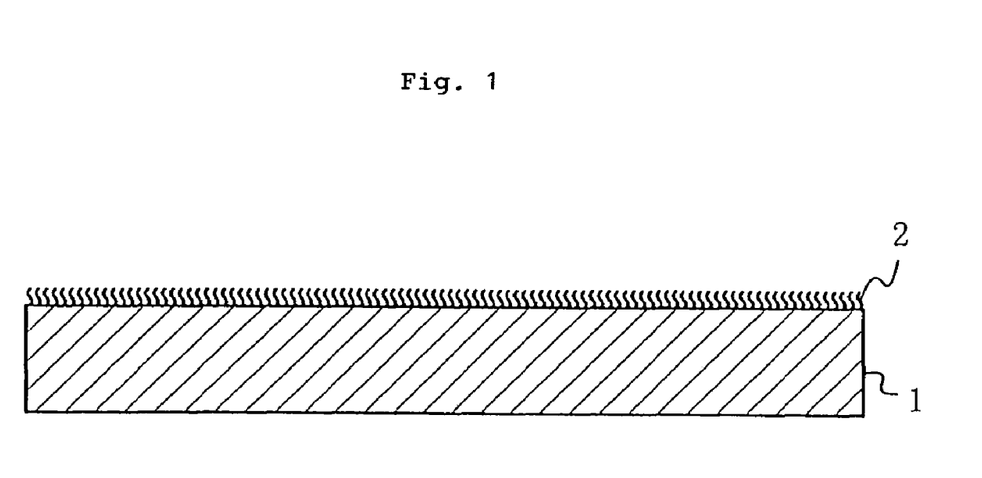
FIG. 1 is a sectional view of a polishing pad of an embodiment according to the present invention.

A pad of an embodiment according to the present invention having a very thin exposed fibrous layer on a surface of an elastic body will be described referring to FIG. 1. FIG. 1 illustrates a sectional view of the polishing pad. Organic fibers are exposed on an elastic body layer 1 made of a resin or an FRP (fiber reinforced plastic) and form a very thin exposed fibrous layer 2.

The structure of the polishing pad of the present invention is not particularly limited, and may be any one, which has, at least on use, organic fibers exposed on the surface abutting to a matter being polished. A preferred example of the structure comprises a resin containing organic fibers. The organic fibers exposed on the surface preferably have a length of 1 cm or less, more preferably 3 mm or less. For example, the exposed parts of the organic fibers preferably have a fiber length of 10 μm to 1 cm, more preferably 10 μm to 3 mm, further preferably 50 to 500 μm. The organic fibers exposed on the surface preferably have a fiber diameter of 1 mm or less, for example, preferably 1 μm to 1 mm, more preferably 10 to 50 μm. The whole polishing pad preferably has a thickness of 0.1 to 5 mm, more preferably 0.5 to 2 mm.

As to the degree of exposure of the organic fibers on the surface of the polishing pad, it is preferable that on average at least one organic fiber having the above-described length is exposed in every square millimeter of the pad surface, and the more, the better. Some organic fibers longer than the above-described preferable exposed length may be included, for example, one or less fiber per square centimeter on average. The diameter of the organic fibers exposed on the surface depends on the diameter of the starting organic fibers as described later, but strands of twisted organic fibers may be unbound and exposed as thinner fibers.

Examples of the organic fibers include fibers of an aramid, a polyester or a polyimide. In case where the polishing pad is made of a resin containing organic fibers, chops obtained by cutting monofilaments of organic fibers into a predetermined length or pulps obtained by smashing chops may be contained in the underlying layer separately, or organic fibers may be contained in the resin in a form of woven fabric or unwoven fabric. Provided that the organic fibers need protrude from the underlying layer and be exposed on at least one surface of the polishing pad. Organic fibers of a non-woven fabric form are firmly fixed by the resin, and their exposed parts have a well nappy form on the surface of the polishing pad. They have another advantage that no texture appears on the surface of the polishing pad.

Preferred organic fibers are aramid fibers, which may be used alone or as a chief fibers. The reason is that aramid fibers have higher shear strength than the common organic fibers, and can be exposed in a better state by mechanically polishing the surface of the polishing pad. In addition, their high tensile strength improves the durability of the polishing pad, extending its lifetime. Aramid fibers include para- and meta-aramid fibers, and para-aramid fibers are preferable to extend the lifetime of the polishing pad by suppressing wear because they have better mechanical properties (e.g. tensile strength) than meta-aramid fibers. Para-aramid fibers are suitable for the moist polishing environment because they are less hygroscopic than meta-aramid fibers. As para-aramid fibers, poly-p-phenylene terephthalamide fibers and poly-p-pheneylenediphenylether terephthalamide fibers are commercially available and may be used in the present invention.

The underlying layer under the exposed fibrous layer (the layer of organic fibers exposed on a surface) is preferably an elastic body layer, such as a resin substrate having a high elastic modulus, which increases the efficiency of planarizing irregularities compared with a pad made of only a resin having a low elastic modulus or a pad produced by allowing organic fibers to adhere to the surface of a resin substrate having a low elastic modulus. In case where the elastic body layer as a underlying layer is made of an FRP that is a resin containing the same organic fibers as that exposed on the surface, the exposed fibers disappeared by abrasion due to polishing or by dressing with a diamond whetstone attached to a polishing apparatus, but are regenerated by the new exposure of the fibers contained in the resin in the underlying layer, and the exposed fibrous layer on the surface is maintained. Accordingly, the polishing pad for CMP reconciles reduction of polishing flaws and improvement of flatness, and is durable and stable enough for good productivity. Examples of resins having low elastic modulus include polyurethane and polyethylene, and examples of resins having high elastic modulus include epoxy resins, acrylic resins and polystyrene.

The underlying layer may have a multilayer structure produced by laminating resin or FRP layers having different elastic moduli. For example, the distribution of the polishing speed in the surface of a substrate being polished can be stabilized by forming an exposed fibrous layer on a surface of a layer having a high elastic modulus and providing a layer having a low elastic modulus under the layer.

As to the materials usable in the polishing pad of the present invention, examples of the organic fibers to be exposed on a surface include above-mentioned aramid fibers, polyester fibers and polyimide fibers, and the resin may be any one that can be formed into a plate shape, such as an epoxy resin. According to a preferred production method of the polishing pad of the present invention, prepregs are previously prepared by combining fibers and a thermosetting resin. Desired numbers of the prepregs are then molded into a plate shape by thermocompression molding (thermal pressing curing), and organic fibers are exposed on a surface at the same time of the molding or by mechanical polishing, such as dressing after the molding. The fiber diameter of the organic fibers used as a material may be 1 mm or less, preferably 50 μm or less, more preferably 1 μm to 1 mm, further preferably 10 to 50 μm. Inorganic fibers, such as glass fibers, may also be used for the production of the prepregs except for the prepreg to be located on a surface for exposing organic fibers on a surface of the polishing pad. The inorganic fibers may be chops obtained by cutting monofilaments into a predetermined length or pulps obtained by smashing chops, or may be woven fabric or non-woven fabric. Preferred examples of thermosetting resins include epoxy resins, such as bisphenol A epoxy resins, phenolic resins and polyimide resins, with epoxy resins particularly preferred.

The polishing pad of the present invention may be produced by using a polishing pad material that comprises a resin containing organic fibers and is produced by thermocompression molding as described above, and forming an exposed fibrous layer by mechanically polishing the surface of the polishing pad material to expose the organic fibers.

For example, the polishing pad material used in the first production method of the present invention has a plate-like shape and comprises fibers and a resin fixing the fibers to form the plate-like shape, and has at least one surface layer which is substantially non-porous and comprises organic fibers and the resin fixing the organic fibers. Not only the surface layer, the whole polishing pad material may contain organic fibers fixed by a resin and be substantially non-porous. In case where the surface layer (or whole the polishing pad material) contains a combination of two or more kinds or organic fibers being different in at least one of material, shape, fiber diameter and fiber length, specific effects can be obtained by selecting the combination. A combination of relatively thicker fibers (about 1.5 deniers, e.g. 8-16 μm in fiber diameter) and relatively thinner fibers (about 0.1 denier, e.g. 0.5-1.5 μm in fiber diameter) both of which are made of the same material is effective to make sure of high polishing speed and flatness because of the interaction of the both fibers. The former fibers contribute to the increase of polishing speed, and the latter to the insurance of flatness. An example is a combination of chops and pulps of para-aramid fibers. A combination of relatively longer fibers (length: about 5 mm, e.g. 3-8 mm) and relatively shorter fibers (length: about 1 mm, e.g. 0.5-2 mm) is also preferable. Non-woven fabrics made from mixtures of different organic fibers can realize such combinations of different fibers. Varying the kinds of fibers in the direction of the thickness of the polishing pad material makes specific effects depending on the combination of the fibers. In case where a polishing pad material comprising a surface layer containing fibers having a high elastic modulus (e.g. aramid fibers) and an underlying backing layer containing fibers having a low elastic modulus (e.g. polyester fibers) is used and mechanically polished to expose the fibers having a high elastic modulus from the surface layer, the surface layer having a high modulus is hardly deformed when a high stress is applied during polishing, and the backing layer having a low elastic modulus absorbs the stress, so that every area of the polishing surface is polished at a uniform speed. Various resins may be used for fixing organic fibers, and some examples include thermoplastic resins, such as acrylic resins and ABS resins, and thermosetting resins, such as phenolic resins, epoxy resins and polyimides. Thermosetting resins have higher elastic moduli compared with thermoplastic resins, and are preferable because they are less worn on polishing or dressing and excel in durability. Epoxy resins having high adhesiveness are particularly preferable. The content of organic fibers in the surface layer is preferably 50% by weight or more, more preferably 70 to 90% by weight. When polished to form an exposed fibrous layer, such a surface layer allows much organic fibers to be exposed on the resulting polishing pad, increasing the effects of reducing the occurrence of polishing flaws.

In the first production method of the present invention, as described above, the organic fibers to be used in the surface layer of the polishing pad material preferably has a form of a non-woven fabric. A polishing pad material wherein organic fiber base materials each having a sheet-form, such as organic fiber non-woven fabrics, may be produced by thermocompression molding a layer of prepreg produced by impregnating an organic fiber base material with a resin and drying. The molding may be carried out in the same manner as in the molding of a laminate for electric insulation. For example, a layer of prepreg produced by impregnating an organic fiber base material with a thermosetting resin and drying is covered with a release film, sandwiched between mirror-finished metallic plates, and thermocompression molded between a pressing heating plates. The layer of prepreg may consist of one sheet of prepreg or a plurality of sheets of prepreg. The number of the sheets of prepreg may be varied, and prepreg of other fiber materials may be used in combination, depending on the kinds of matters to be polished, such as silicon wafer, or on the polishing conditions. An example of such combinations is a polishing pad wherein the surface layer is made from aramid fiber base material prepreg, and the backing layer is made from polyester fiber material prepreg.

To form an exposed fibrous layer by mechanically polishing the surface layer of the above-described polishing pad material, the surface of the polishing pad material may be previously napped by previously polishing with a ceramic roll or a sand blast. Alternatively, after the polishing pad material is attached to an apparatus for polishing a substrate, the surface of the sheet-like pad material described above may be subjected to the above-described dressing treatment, whereby the resin on the surface is ground off with a diamond whetstone and fibers are exposed. The diamond whetstone may be replaced by a wire brush, a metal scraper, a resin brush, or a glass or alumina ceramics plate.

As to the conditions of the dressing treatment, in case where a diamond whetstone is used, the particle size of the diamond particles adhering to the diamond whetstone is preferably not less than #60 count and not more than #400 count in particle size as established by JIS-B-4130, more preferably not less than #100 count and not more than #320 count. The pressure applied during the dressing treatment depends on the polishing apparatus used and the polishing pad material used, and is generally 1 to 20 kPa. The revolution speed for the dressing treatment depends on the polishing machine used. For example, in case of a Mirra machine produced by AMAT Co., Ltd. (fixing disc diameter: 50 cm), 10 to 100 rpm is efficient.

The state where organic fibers are exposed on a surface by dressing treatment may be made before beginning polishing of substrates, or before polishing every substrate. Alternatively, a polishing pad material may be used for polishing substrates without dressing so that an exposed fibrous layer is formed by the abrasion of the polishing pad surface progressing simultaneously with polishing of the substrates.

It is also possible to produce the polishing pad of the present invention by layering, when molding materials containing organic fibers and a resin are thermocompression molded, the molding materials so that organic fibers are exposed on the surface of the polishing pad after the thermocompression molding. This method enables the organic fibers to be exposed on the surface of the polishing pad without mechanical polishing, such as dressing treatment. For example, when molding materials, such as a resin or FRP, such as prepreg, are formed into a plate like form by pressing, etc., organic fibers in a state of a non-woven fabric or the like may be pressed against the surface of the molding material to transfer the organic fibers. The second production method of the present invention is a preferred embodiment of this production method.

According to the second production method of the present invention, a resin-impregnated sheet-form fiber base material and a resin-unimpregnated sheet-form fiber base material are layered so that a resin-unimpregnated sheet-form fiber base material is located on at least one surface, and unifying them by thermocompression molding. The resin-unimpregnated sheet-form fiber base material located on the surface shall consist of organic fibers. This makes the state where the organic fibers are exposed on the surface.

The number of each of the resin-impregnated sheet-form fiber base material and the resin-unimpregnated sheet-form fiber base material is not particularly limited, and may be varied depending on the desired thickness of the polishing pad. Further, the layering order of these sheet-form fiber base materials is not particularly limited, provided a resin-unimpregnated sheet-form fiber base material comprising organic fibers is located on one surface. For example, at least one, preferably 1 to 3 resin-unimpregnated sheet-form fiber base materials may be layered on layered resin-impregnated sheet-form fiber base materials, or a plurality of resin-impregnated sheet-form fiber base materials and a plurality of resin-unimpregnated sheet-form fiber base materials may be layered alternately.

Under the resin-unimpregnated sheet-form fiber base material comprising organic fibers and being located on the surface, resin-impregnated or -unimpregnated sheet-form fiber base materials comprising fibers other than organic fibers, such as sheet-form glass fiber base materials, may be used, but preferably resin-impregnated or resin-unimpregnated sheet-form fiber base materials that also comprise organic fibers. In the later case, the exposed organic fibers disappear by abrasion due to polishing or dressing for roughening the surface, but are regenerated by new exposure of the organic fibers contained in the resin in the underlying layer, and the exposed organic fiber layer is maintained.

The resin-unimpregnated sheet-form fiber base material may be formed by the mutual bonding of fibers due to their fusion, or by bonding fibers mutually with an adhesive. Examples of usable adhesives are adhesives comprising epoxy resins, such as a water-soluble epoxy resin binder. In case where an adhesive is used, non-limitative but preferable amount of the adhesive used is 3 to 20 parts by weight, more preferably 5 to 15 parts by weight relative to 100 parts by weight of fibers. The unit weight of the resin-unimpregnated sheet-form fiber base material is preferably 36 to 100 g/m$^2$, more preferably 55 to 72 g/m$^2$.

The resin-impregnated sheet-form fiber base material is produced by impregnating a resin-unimpregnated sheet-form fiber base material with a resin. The content of the fiber base material in the resin-impregnated sheet-form fiber base material is preferably 60 to 140 parts by weight, more preferably 90 to 120 parts by weight relative to 100 parts by weight of the total of the resin and adhesive used.

The content of resin-unimpregnated sheet-form fiber base material in the whole body may be selected considering the content of fibers in a polishing pad, particularly the content of organic fibers in the surface layer to be pressed against a matter being polished. According to this method, the content of fibers in a polishing pad can be varied by varying the ratio of resin-unimpregnated sheet-form fiber base materials used, without varying the impregnating amount of a resin used for the production of prepreg.

In the thermocompression molding, heating temperature is generally 150 to 200° C., preferably 160 to 180° C., and pressure is generally 50 to 500 kPa, preferably 200 to 400 kPa.

According to second production method, the state where organic fibers are exposed on a surface can be made without mechanical polishing, but polishing, such as dressing treatment, may optionally be carried out to control the exposed state of organic fibers.

The steps of the second production method may be modified to employ this method only for the control of fiber content, thereby producing a polishing pad material having no exposed fibers on its surface, and the exposed state of organic fibers may be made by mechanically polishing the surface. The modified method is the third production method, wherein a resin-impregnated sheet-form fiber base material and a resin-unimpregnated sheet-form fiber base material are layered so that a resin-unimpregnated sheet-form fiber base material comprising organic fibers is located on at least one surface. They are then unified by thermocompression molding, to form a polishing pad material having no surface on which the organic fibers are exposed. The organic fibers are exposed by mechanically polishing the surface of the polishing pad material on which the resin-unimpregnated sheet-form fiber material is located, to obtain the polishing pad of the present invention.

According to the method of polishing a substrate of the present invention, a substrate is polished by pressing the substrate against the surface of the polishing pad of the present invention on which the organic fibers are exposed, and relatively sliding the substrate and the polishing pad while an abrasive (CMP abrasive) is being fed between the substrate and the polishing pad.

Non-limitative but preferred CMP abrasives usable in the present invention are obtainable by dispersing a composition comprising cerium oxide particles, a dispersing agent and water, and further adding additives thereto, and contains 0.5 to 20% by weight of cerium oxide particles. The method of producing the cerium oxide particles is not particularly limited, and the average particle diameter of the cerium oxide particles contained in the CMP abrasive is preferably 0.01 to 1.0 μm. Cerium oxide particles having an average particle diameter of less than 0.01 μm may adversely lower the polishing speed, and those of an average particle diameter of more than 1.0 μm tend to make flaws on the film being polished.

Examples of usable substrates include a semiconductor substrate on which circuit elements and wiring patterns are formed, and a substrate wherein a layer of silicon oxide film or silicon nitride film is formed on a semiconductor substrate on which circuit elements are previously formed. By polishing the layer of the silicon oxide film or silicon nitride film formed on the semiconductor substrate using the CMP abrasive as above, the irregularities on the surface of the layer of the silicon oxide film is planarized, and a flat surface is formed throughout the semiconductor substrate. This method is also applicable to shallow trench isolation.

Any polishing apparatus may be used, such as a disc-type polishing apparatus, a linear-type polishing apparatus or a web-type polishing apparatus. An example is a common disc-type polishing apparatus, which has a holder for holding a semiconductor substrate and a fixing disc (equipped with a variable-revolution number motor) for bonding a polishing pad. The polishing condition is not particularly limited, but is preferably adjusted to the optimum one for each matter to be polished. During polishing, a slurry is continuously fed to the surface of the polishing pad by using a pump or the like. The feeding rate of the slurry is not limited, but preferably such that the surface of the polishing pad is always covered with the slurry.

After the polishing, the semiconductor substrate is preferably washed in a stream of water sufficiently, and then dried after the water droplets sticking thereto are blew away by using a spin drier or the like.

The polishing pad of the present invention may be used for polishing not only a silicon oxide film formed on a semiconductor substrate but also an inorganic insulation film formed on a wiring board having desired wiring, such as a silicon oxide, glass or silicon nitride film, polysilicon, a film consists mainly of Al, Cu, Ti, TiN, W, Ta or TaN, optical glass, such as a photo-mask, a lens or a prism, inorganic conductive film, such as ITO, an optical integrated circuit, an optical switching device and an optical guide, which are made of glass and a crystalline material, the end faces of an optical fiber, optical single crystal, such as a scintillator, a solid-state laser, a sapphire substrate for blue laser LED, semiconductor single crystal, such as SiC, GaP or GaAS, a glass or aluminum substrate for magnetic discs, a magnetic head or the like.

Hereinafter, the present invention will be described referring to Examples, which, however, do not limit the scope of the present invention.

EXAMPLES

Examples 1 and 2 and Comparative Examples 1 to 3

(Production of Pad)

The following organic fibers were prepared as raw materials.

[Aramid fiber base material "1"]

Para-aramid fiber chops (fiber diameter: 12.5 µm, fiber length: 5 mm, "TECNORA" produced by Teijin, Ltd.) and meta-aramid fiber chops (fiber diameter: 25 µm, fiber length: 6 mm, softening temperature: 280° C., non-oriented, "CORNEX" produced by Teijin Ltd.) were mixed and made into a mat. A 20% by weight aqueous solution of a water-soluble epoxy resin binder (glass transition temperature: 110° C., trade name: "V-COAT", produced by Dainippon Ink & Chemicals, Inc.) was sprayed to the mat, and dried by heating (150° C., 3 min.), to give a non-woven fabric of a unit weight of 70 g/m$^2$. The weight ratios of para-aramid fiber/meta-aramid fiber/resin binder were 85/5/10. The non-woven fabric was compressed with heat by passing it through a couple of heating rolls (temperature: 300° C., linear pressure: 196 kN/m), to give aramid fiber base material "1", which was a non-woven fabric wherein the meta-aramid fibers adhered to the para-aramid fibers by thermal fusion. The para-aramid fibers are poly-p-phenylene-3,4-diphenyl ether terephthalamide fibers.

The following resin was prepared as a raw material.

[Resin "1"]

Varnish (A) of a bisphenol A epoxy resin (produced by Yuka Shell Co., Ltd., Trade name: EP-828SK) containing dicyandiamide as a curing agent and 2-ethyl-4-methylimidazole as a curing accelerator was prepared. For the preparation of varnish (A), 20 parts by weight of the curing agent, 0.1 part by weight of the curing accelerator and 40 parts by weight of methyl ethyl ketone as a solvent were used relative to 100 parts by weight of the bisphenol A epoxy resin.

A prepreg sheet for lamination was produced by combining fibers and a resin material.

[Prepreg "1"]

Aramid fiber material "1" was impregnated with varnish (A) and heated to dry (170° C., 5 min.), to produce prepreg. The amount of adhering resin was adjusted so that the thickness became 0.1 mm after thermocompression molding. The content of fibers was 50% by weight.

Example 1

A release film (a 50 µm-thick polypropylene film) was put on both surfaces of a prepreg layer consisting of 15 sheets of prepreg "1," put in layers. They were sandwiched between mirror-finished plates and thermocompression molded (temperature: 175° C., pressure: 400 kPa, time: 120 min.) between pressing hot plates, with two sheets of 10 mm-thick cushion interposed, to give a 1.5 mm-thick laminate. A polishing pad was produced by sticking the laminate to the fixing disc of a polishing machine, and dressing it with a diamond whetstone of #70 count for 10 minutes under a pressure of 8820 Pa (90 g/cm$^2$) at revolutions of 38 rpm to form a very thin layer of exposed aramid fibers on a surface. The exposed parts of the aramid fibers had a fiber length of 1 mm and a fiber diameter of 12.5 µm.

Example 2

A polishing pad was produced by sticking a laminate, which was produced in the same manner as in Example 1, to the fixing disc of a polishing machine, and dressing it with a diamond whetstone of #150 count for 10 minutes under a pressure of 8820 Pa (90 g/cm$^2$) at revolutions of 38 rpm to form a very thin layer of exposed aramid fibers on a surface. The exposed parts of the aramid fibers were shorter than those of Example 1, and had a fiber length of 500 µm and a fiber diameter of 12.5 µm.

Comparative Example 1

Surface-roughened (35 µm) copper foil was put on both sides of a prepreg layer consisting of 15 sheets of prepreg "1," put in layers. They were sandwiched between mirror-finished plates, with a release film (a 50 µm-thick polypropylene film) interposed between them and the mirror-finished plates, and thermocompression molded under the same conditions as in Example 1 between pressing hot plates, with two 10-mm-thick cushions interposed between the mirror-finished plates and the pressing hot plates, to give a 1.5-mm-thick laminate. The copper foil on the laminate was etched away with an aqueous ammonium persulfate solution, to produce a pad that had surfaces having irregularities of Ra=0.9 µm in center line average roughness. The resulting substrate was stuck to the fixing disc of a polishing machine, but fibers were not exposed on surfaces by any method, such as dressing with a diamond whetstone. The center line average roughness of Ra=0.9 μm on the surfaces of the pad was made for holding polishing particles during CMP polishing.

Comparative Example 2

An existing polishing pad (produced by Rodehl Co., Ltd., IC-1000) made of a foamed polyurethane resin was stuck to the fixing disc of a polishing machine, and was dressed with a diamond whetstone of #70 count for 10 minutes under a pressure of 8820 Pa (90 g/cm$^2$) at revolutions of 38 rpm.

Comparative Example 3

A pad produced by impregnating a non-woven fabric consisting of bundles of polyester fibers with a foamed polyurethane resin having low elasticity was stuck to a fixing disc of a polishing machine, and was then used without being subjected any treatment, such as dressing with a diamond whetstone. No fibers were exposed on the surface of the pad. Even after the polishing for evaluation of polishing characteristics described later, no fibers were exposed on the surface.

The polishing characteristics of the pads produced in Examples and Comparative Examples were evaluated as follows.

(Preparation of Cerium Oxide Slurry)

A CMP slurry as an abrasive was prepared as follows.

2 kg of cerium carbonate hydrate was placed in a platinum vessel and calcined in the air at 800° C. for 2 hours to obtain cerium oxide powder. 1 kg of the cerium oxide powder was ground by dry grinding by using a jet mill. 23 g of an aqueous polyammonium acrylate solution (40% by weight) and 8977 g of deionized water were admixed thereto, and ultrasonic dispersion was carried out for 10 minutes with stirring. The resulting slurry was filtered through a 1-μm filter, and deionized water was added to obtain 5 wt % slurry. The pH of the slurry was 8.3. Measurement of the slurry particles in the slurry was carried out by using a laser diffraction granulometer after the slurry was diluted to a suitable concentration for the measurement. D99% of the particle diameter was 0.99 μm.

(Preparation of Insulation Film Substrate Matter to be Polished)

Blanket wafers were prepared by forming 2000-nm silicon oxide film on Si substrates of ϕ127 mm by a TEOS-plasma CVD technique. Test wafers as polishing subjects were prepared by forming aluminum wiring of a pattern of 0.1 mm in width, 1 mm in thickness and 0.1 mm in interval on Si substrates of ϕ 200 mm and forming thereon 2000-nm silicon oxide film by a TEOS-plasma CVD technique.

(Polishing Method and Evaluation of Polishing) Characteristics

Each of the former wafer was set to a holder bearing an absorbent pad stuck thereto for attaching a wafer substrate was stuck, and the holder with the insulation film looking downward was placed on a fixing disc of ϕ380 mm to which a polishing pad produced as above had been stuck, and the processing load was set to 300 gf/cm$^2$ (3.04×10$^4$Pa). The insulation film was polished by rotating the fixing disc and the wafer at 38 rpm for 2 minutes while the above-described cerium oxide abrasive (solids content: 1% by weight) was dropped on the fixing disc at a rate of 150 cc/min. The polished wafer was washed with pure water sufficiently, and then dried. The difference between the film thicknesses before and after the polishing was determined by using a light interference film thickness measuring apparatus, and the polishing speed was calculated. As to the evaluation of polishing flaws, the surface of the polished wafer was observed by using a dark-field microscope, to count the flaws made on the surface of the wafer due to polishing.

As to the evaluation of flatness, 1 μm of the difference in level between the convexes and the concaves of each TEG wafer was ground, and the final difference in level was measured before the aluminum at the convexes was exposed.

The results of these evaluations on the polishing pads produced in Examples and Comparative Examples are listed in Table 1. The results show that as compared with the polishing pads of Comparative Examples (prior art), those of Examples according to the present invention had higher polishing speed and made less polishing flaws while ensuring flatness. The results of Examples 1 and 2 show that longer fibers exposed on a surface make less polishing flaws, and shorter fibers make better flatness. This indicates that desired polishing characteristics could be attained by controlling fiber length.

TABLE 1

| | | Polishing pad | | |
|---|---|---|---|---|
| Sample | | Material/Structure | Diamond dressing | State of surface |
| Ex. | 1 | aramid fiber/epoxy resin | 70 count/10 min | Fibers were exposed on resin. |
| | 2 | aramid fiber/epoxy resin | 150 count/10 min | Fibers were exposed on resin. |
| Comp. Ex. | 1 | aramid fiber/epoxy resin | No | fine irregularities on surface |
| | 2 | foamed polyurethane resin | 70 count/10 min | foaming pores (ϕ30 μm) |
| | 3 | polyester fiber/foamed polyurethane resin | No | continuous foaming pores |

| | | Polishing characteristics | | |
|---|---|---|---|---|
| Sample | | Polishing speed (nm/min) | Number of Polishing Flaws (number/wafer) | Flatness (nm) |
| Ex. | 1 | 240 | 0 | 50 |
| | 2 | 270 | 10 | 30 |
| Comp. Ex. | 1 | 250 | 210 | 20 |
| | 2 | 180 | 30 | 30 |
| | 3 | 120 | 0 | 250 |

Examples 3 to 7

(Production of Pad)

The following organic fibers were prepared as raw materials.

[Polyester Fiber Base Material "1"]

A non-woven fabric consisting of polyester fibers having a fiber diameter of 12.5 μm and a fiber length of 5 mm and having a unit weight of 70 g/m$^2$ ([EPM-4070TE] produced by Nippon Byleen Co., Ltd.).

[Aramid fiber base material "2"]

Para-aramid fiber chops (fiber diameter: 12.5 μm, fiber length: 5 mm, "KEVLAR" produced by DuPont Kabushiki Kaisha), para-aramid fiber pulps (fiber diameter: 0.83 μm, fiber length: 1 mm, "KEVLAR" produced by DuPont Kabushiki Kaisha) and meta-aramid fiber chops (fiber diameter: 25 μm, fiber length: 6 mm, softening temperature: 280° C., "CORNEX" produced by Teijin Ltd.) were mixed and made into a mat. A 20% by weight aqueous solution of a water-soluble epoxy resin binder (glass transition temperature: 110° C., trade name: "V-COAT", produced by Dainippon Ink & Chemicals, Inc.) was sprayed to the mat, and dried by heating (150° C., 3 min.). The mat was then compressed with heat by passing it through a couple of heating rolls (temperature: 300° C., linear pressure: 196 kN/m), to give aramid fiber base material "2", which was a non-woven fabric wherein meta-aramid fiber chops adhered to para-aramid fiber chops by thermal fusion. The aramid fiber base material "2" had a unit weight of 70 g/m², and the weight ratios of para-aramid fiber chop/para-aramid fiber pulp/meta-aramid fiber chop/epoxy resin binder were 58/17/8/17. The para-aramid fibers are poly-p-phenylene terephthalamide fibers.

Prepreg sheets for lamination were produced by combining the fibers and a resin material.

[Prepreg "2"]

Polyester fiber base material "1" was impregnated with varnish (A) and heated to dry (170° C., 5 min.), to produce prepreg. The amount of adhering resin was adjusted so that the thickness became 0.1 mm after thermocompression molding. The content of polyester fibers after thermocompression molding was 50% by weight.

[Prepreg "3,"]

Aramid fiber base material "2" was impregnated with varnish (A) and heated to dry under the same conditions as for prepreg "2", to produce prepreg. The amount of adhering resin was adjusted so that the thickness became 0.1 mm after thermocompression molding. The content of aramid fibers after thermocompression molding was 50% by weight.

[Prepreg "4"]

A glass fiber woven fabric (unit weight: 107 g/m², "GC-216" produced by Asahi Schueber) was impregnated with varnish (A) and heated to dry under the same conditions as for prepreg "2", to produce prepreg. The amount of adhering resin was adjusted so that the thickness became 0.1 mm after thermocompression molding. The content of glass fibers after thermocompression molding was 60% by weight.

Example 3

10 sheets of prepreg "2" and 10 sheets of polyester fiber base material "1" impregnated with no resin were layered so that prepreg "2" and polyester fiber base material "1" were layered alternately, and thermocompression molded in the same manner as in Example 1, to obtain a 1.5-mm-thick laminate. The fiber content in the whole laminate was 67% by weight. One surface of the laminate (the surface made of polyester fiber base material "1" impregnated with no resin) was dressed in the same manner as in Example 2 to form a very thin layer of exposed polyester fibers (the exposed polyester fibers had a fiber length of 500 μm and a fiber diameter of 12.5 μm), thereby obtaining a polishing pad.

Example 4

10 sheets of prepreg "3" and 10 sheets of aramid fiber base material "2" impregnated with no resin were layered so that prepreg "3" and aramid fiber base material "2" were layered alternately, and thermocompression molded in the same manner as in Example 1, to obtain a 1.5-mm-thick laminate. The fiber content in the whole laminate was 67% by weight. One surface of the laminate (the surface made of fiber base material "2" impregnated with no resin) was dressed in the same manner as in Example 2 to form a very thin layer of exposed aramid fibers (the exposed aramid fibers had a fiber length of 500 μm and a fiber diameter of 12.5 μm), thereby obtaining a polishing pad.

Example 5

A polishing pad was produced in the same manner as in Example 4 except the surface of the laminate was not dressed. Even in this case, a very thin layer of exposed aramid fibers (the exposed aramid fibers had a fiber length of 2 mm and a fiber diameter of 12.5 μm), though not so much as in Example 4, was formed on the surface made of aramid fiber base material "2" impregnated with no resin.

Example 6

14 sheets of prepreg "3" were layered, and 2 sheets of aramid fiber base material "2" impregnated with no resin were layered thereon, and they were thermocompression molded in the same manner as in Example 1, to obtain a 1.5-mm-thick laminate. The fiber content in the surface layer of the laminate (a layer comprising aramid fiber base material "2" impregnated with no resin and the resin that oozed out from the underlying layer on the thermocompression molding and was partially kept in the aramid fiber base material "2" impregnated with no resin) was 67% by weight. One surface of the laminate (the surface made of fiber base material "2" impregnated with no resin) was dressed in the same manner as in Example 2 to form a very thin layer of exposed aramid fibers (the exposed aramid fibers had a fiber length of 500 μm and a fiber diameter of 12.5 μm), thereby obtaining a polishing pad.

Example 7

14 sheets of prepreg "4" were layered, and 2 sheets of aramid fiber base material "2" impregnated with no resin were layered thereon, and they were thermocompression molded in the same manner as in Example 1, to obtain a 1.5-mm-thick laminate. The fiber content in the surface layer of the laminate was 67% by weight. One surface of the laminate (the surface made of fiber base material "2" impregnated with no resin) was dressed in the same manner as in Example 2 to form a very thin layer of exposed aramid fibers (the exposed aramid fibers had a fiber length of 500 μm and a fiber diameter of 12.5 μm), thereby obtaining a polishing pad.

Comparative Example 4

15 sheets of prepreg "3" were layered and thermocompression molded in the same manner as in Example 1, to obtain a polishing pad that was a 1.5-mm-thick laminate subjected to no dressing treatment on its surface. The fiber content in the whole laminate was 50% by weight. On the surface of the polishing pad, only epoxy resin was observed, and no fiber was exposed. Even after the polishing for the evaluation of polishing characteristics described later, no fiber was exposed.

The polishing characteristics of the polishing pads produced in Examples 3 to 7 and Comparative Example 4 were evaluated in the same manner as that described above, and the ressults are listed in Table 2.

TABLE 2

| | | Polishing pad | | |
|---|---|---|---|---|
| Sample | | Material/ Structure | Diamond dressing | State of surface |
| Ex. | 3 | polyester fiber/ epoxy resin | 150 count/10 min | Fibers were exposed on resin. |
| | 4 | aramid fiber/ epoxy resin | 150 count/10 min | Fibers were exposed on resin. |
| | 5 | aramid fiber/ epoxy resin | No | Fibers were exposed on resin. |
| | 6 | aramid fiber/ epoxy resin | 150 count/10 min | Fibers were exposed on resin. |
| | 7 | aramid fiber/ glass fiber/ epoxy resin | 150 count/10 min | Fibers were exposed on resin. |
| Comp. Ex. | 4 | aramid fiber/ epoxy resin | No | no exposed fibers (epoxy resin only) |

| | | Polishing characteristics | | |
|---|---|---|---|---|
| Sample | | Polishing speed (nm/min) | Number of Polishing Flaws (number/wafer) | Flatness (nm) |
| Ex. | 3 | 240 | 0 | 30 |
| | 4 | 270 | 0 | 30 |
| | 5 | 200 | 90 | 20 |
| | 6 | 270 | 0 | 30 |
| | 7 | 270 | 0 | 30 |
| Comp. Ex. | 4 | 10 | 250 | could not be determined |

Examples 8 to 12

(Production of Polishing Pad)
The following organic fibers were prepared.

[Arimid Fiber Base Material "3"]
Arimid fiber base material "3" that is a non-woven fabric was produced in the same manner as in the production of aramid fiber base material "1" except the para-aramid fibers were changed from the poly-p-phenylene 3,4-diphenyl ether terephthalamide fiber chops to poly-p-phenylene terephthalamide fiber chops (fiber diameter: 1.5 deniers (12.5 μm), fiber length: 5 mm, "KEVLAR" produced by Du Pont Kabushiki Kaisha).

[Aramid Fiber Base Material "4"]
Aramid fiber base material "4" that is a non-woven fabric" was produced in the same manner as in the production of aramid fiber base material "1" except the para-aramid fiber chops were not used but only meta-aramid fiber chops (fiber diameter: 3 deniers (25 μm), fiber length: 6 mm, softening temperature: 280° C., "CORNEX" produced by Teijin Ltd.) were used.

[Polyester Fiber Base Material "2"]
A woven fabric having a weave density of 48 fibers in length/48 fibers in width, a unit weight of 130 g/m², a fiber diameter of 3.0 deniers (25 μm) ("BKE POPRIN" produced by Asahi Chemical Industry Co., Ltd.).

The following prepregs were prepared.
[Prepreg "5"]
Aramid fiber base material "3" was impregnated with varnish (A) and heated to dry (170° C., 5 min., the same will be applied hereinafter), to produce prepreg. The amount of adhering resin was adjusted so that the thickness became 0.1 mm after thermocompression molding. The content of aramid fibers after thermocompression molding was 50% by weight.

[Prepreg "6"]
Aramid fiber base material "4" was impregnated with varnish (A) and heated to dry, to produce prepreg. The amount of adhering resin was adjusted so that the thickness became 0.1 mm after thermocompression molding. The content of aramid fibers after thermocompression molding was 50% by weight.

[Prepreg "7"]
Polyester fiber base material "2" was impregnated with varnish (A) and heated to dry, to produce prepreg. The amount of adhering resin was adjusted so that the thickness became 0.1 mm after thermocompression molding. The content of aramid fibers after thermocompression molding was 50% by weight.

Example 8

A 1.5-mm-thick laminate was produced by thermocompression molding 15 sheets of prepreg "3" in the same manner as in Example 1.

Example 9

A 1.5-mm-thick laminate was produced by thermocompression molding 15 sheets of prepreg "5" in the same manner as in Example 1.

Example 10

A 1.5-mm-thick laminate was produced by thermocompression molding 15 sheets of prepreg "6" in the same manner as in Example 1.

Example 11

7 sheets of prepreg "1" were layered for a surface layer, and, beneath them, 8 sheets of prepreg "7" were layered for backing layer. They are then thermocompression molded in the same manner as in Example 1, to obtain a 1.5-mm-thick laminate.

Example 12

7 sheets of prepreg "3" were layered for a surface layer, and, beneath them, 8 sheets of prepreg "7" were layered for backing layer. They are then thermocompression molded in the same manner as in Example 1, to obtain a 1.5-mm-thick laminate.

Comparative Example 5

A 1.5-mm-thick laminate was produced by thermocompression molding 15 sheets of prepreg "4" in the same manner as in Example 1.

The laminates obtained in Examples 8 to 12 and Comparative Example 5 were used as polishing pad materials, which were dressed in the same manner as in Example 2, to obtain polishing pads. The polishing characteristics of the polishing pads are listed in Table 3. Among the polishing characteristics, the number of polishing flaws, polishing speed and flatness were evaluated in the same manner as that described above. Polishing evenness was evaluated by measuring the polishing speeds of a silicon oxide film at various points on the surface of a silicon wafer, and obtaining the average polishing speed and standard deviation thereof, and was presented by the percentage of the latter based on the former. The durability of the polishing pads were presented in Table 3 by indexes when the life-time of the polishing pad of Comparative Example 2 (IC-1000, produced by Rodehl Co., Ltd.), which is a prior art polishing pad made of a foamed polyurethane resin, is defined as 100.

TABLE 3

| | Polishing Pad | | |
|---|---|---|---|
| | Surface layer Material | Backing layer Material | State of Surface |
| Ex. 8 | aramid fibers (size combination)/ epoxy resin | no backing layer | Fibers were exposed on resin. |
| Ex. 9 | para-aramid fiber/ epoxy resin | no backing layer | Fibers were exposed on resin. |
| Ex. 10 | meta-aramid fiber/ epoxy resin | no backing layer | Fibers were exposed on resin. |
| Ex. 11 | aramid fiber/ epoxy resin | polyester fiber/ epoxy resin | Fibers were exposed on resin. |
| Ex. 12 | aramid fibers (size combination)/ epoxy resin | polyester fiber/ epoxy resin | Fibers were exposed on resin. |
| Comp. Ex. 5 | glass fiber/ epoxy resin | no backing layer | surface having fine irregularities/ little exposure of fibers |

| | Polishing flaws (number/ wafer) | Polishing speed (nm/min) | Flatness (nm) | Evenness of polishing (%) | Durability |
|---|---|---|---|---|---|
| Ex. 8 | 5 | 250 | 20 | 8 | 95 |
| Ex. 9 | 10 | 250 | 40 | 8 | 95 |
| Ex. 10 | 2 | 200 | 100 | 8 | 75 |
| Ex. 11 | 10 | 250 | 40 | 4 | 100 |
| Ex. 12 | 5 | 250 | 30 | 4 | 95 |
| Comp. Ex. 5 | ≧1000 | 150 | 50 | 4 | 120 |

Comparison of Example 8 and Example 2 indicates that combining relatively thicker fibers with thinner fibers effectively improves the flatness of the polished surface of a substrate. Comparison of Example 9 and Example 10 indicates the durability of a polishing pad is improved by using para-aramid fibers in place of meta-aramid fibers. From the results of Example 11 and Example 12, it was confirmed that evenness of polishing could be improved by providing beneath a surface layer a backing layer containing fibers having a lower elastic modulus than that of fibers contained in the surface layer.

INDUSTRIAL APPLICABILITY

According to the polishing method of a substrate of the present invention using the polishing pad for CMP of the present invention that is produced by exposing organic fibers on the surface of an elastic body made of a resin, a step of planarizing interlayer insulation film, a BPSG film (a silicon dioxide film doped with boron and phosphorus) and a step of constituting shallow trench isolation can be carried out efficiently, while suppressing the occurrence of flaws on the substrate.

According to the production method of the present invention, the polishing pad having organic fibers exposed on its surface can be produced easily, and the content of organic fibers in the polishing pad can be varied easily depending on the purposes for which the polishing pad is used.

The invention claimed is:

1. A polishing pad for polishing a substrate or a thin film formed on a substrate, which polishing pad comprises a substantially non-porous surface layer and contains organic fibers exposed on a surface of the polishing pad,
   wherein the surface on which the organic fibers are exposed is a surface of the surface layer, and
   wherein the organic fibers are para-aramid fibers or consist chiefly of para-aramid fibers; and
   wherein the organic fibers are exposed on a surface of the surface layer in a length of 10 μm to 1 cm.

2. The polishing pad of claim 1, wherein the para-aramid fibers are poly-p-phenylene diphenyl ether terephthalamide fibers.

3. The polishing pad of claim 1, wherein the organic fibers exposed on the surface layer of the polishing pad have a diameter of 1 mm or less.

4. A method of polishing a substrate, comprising pressing the substrate against the surface of the polishing pad of any one of claims 1, 2 and 3, on which the organic fibers are exposed, and relatively sliding the substrate and the polishing pad while an abrasive is being fed between the substrate and the polishing pad.

5. A polishing pad for polishing a substrate or a thin film formed on a substrate, which polishing pad comprises a substantially non-porous surface layer and contains organic fibers exposed on a surface of the polishing pad,
   wherein the surface on which the organic fibers are exposed is a surface of the surface layer, and
   wherein the organic fibers are meta-aramid fibers or consist chiefly of meta-aramid fibers; and
   wherein the organic fibers are exposed on a surface of the surface layer in a length of 10 μm to 1 cm.

6. The polishing pad of claim 5, wherein the organic fibers exposed on the surface layer of the polishing pad have a diameter of 1 mm or less.

7. A method of polishing a substrate, comprising pressing the substrate against the surface of the polishing pad of any one of claims 5 and 6 on which the organic fibers are exposed, and relatively sliding the substrate and the polishing pad while an abrasive is being fed between the substrate and the polishing pad.

8. The polishing pad of one of claims 1 and 5, wherein the polishing pad is made of a substantially non-porous polishing pad material comprising a resin and the organic fibers contained in the resin by mechanically polishing a surface of the polishing pad material to form the surface of the polishing pad on which the organic fibers are exposed.

9. The polishing pad of claim 8, wherein the surface of the polishing pad on which the organic fibers are exposed is produced by mechanically polishing the polishing pad material by using a dresser attached to a polishing apparatus.

10. The polishing pad of one of claims 1 and 5, wherein the polishing pad is produced by thermocompression molding of a molding material containing the organic fibers and a resin, and wherein the surface of the polishing pad on which the organic fibers are exposed is produced at the time of the thermocompression molding by layering a resin-impregnated sheet-form fiber base material and a resin-unimpregnated sheet-form fiber base material so that a resin-unimpregnated sheet-form fiber base material comprising organic fibers is located on at least one surface, and unifying them by thermocompression molding.

11. A polishing pad having a multilayer structure, comprising the polishing pad of any one of claims 1, 2, 3, 5 and 6, and a backing layer having an elastic modulus lower than the surface layer of the polishing pad, which are laminated together.

12. A method of polishing a substrate, comprising pressing the substrate against the surface of the polishing pad of claim 8 on which the organic fibers are exposed, and relatively sliding the substrate and the polishing pad while an abrasive is being fed between the substrate and the polishing pad.

13. A method of polishing a substrate, comprising pressing the substrate against the surface of the polishing pad of claim 9 on which the organic fibers are exposed, and relatively sliding the substrate and the polishing pad while an abrasive is being fed between the substrate and the polishing pad.

14. A method of polishing a substrate, comprising pressing the substrate against the surface of the polishing pad of claim 10 on which the organic fibers are exposed, and relatively sliding the substrate and the polishing pad while an abrasive is being fed between the substrate and the polishing pad.

15. A method of polishing a substrate, comprising pressing the substrate against the surface of the polishing pad of claim 11 on which the organic fibers are exposed, and relatively sliding the substrate and the polishing pad while an abrasive is being fed between the substrate and the polishing pad.

* * * * *